United States Patent [19]
Hagner et al.

[11] Patent Number: 4,574,466
[45] Date of Patent: Mar. 11, 1986

[54] HIGH QUALITY GATE OXIDES FOR VLSI DEVICES

[75] Inventors: George F. Hagner, Chandler; Kothandaraman Ravindhran, Mesa, both of Ariz.

[73] Assignee: GTE Communication Systems Corporation, Phoenix, Ariz.

[21] Appl. No.: 680,109

[22] Filed: Dec. 10, 1984

[51] Int. Cl.$^4$ .......................................... H01L 21/306
[52] U.S. Cl. ............................. 29/571; 148/DIG. 81; 148/DIG. 118; 156/657; 427/93; 427/255.4
[58] Field of Search .......... 29/571; 148/1.5, DIG. 81, 148/DIG. 118; 156/657; 427/93, 255.3, 255.4

[56] References Cited

U.S. PATENT DOCUMENTS 4,214,919 7/1980 Young ............................... 29/571 X
4,518,630 5/1985 Grasser ................................. 427/93

Primary Examiner—Brian E. Hearn
Assistant Examiner—Alan E. Schiavelli
Attorney, Agent, or Firm—John A. Odozynski

[57] ABSTRACT

In a 1.2 micron CMOS process, the gate oxide is formed by growing a 1000 Angstrom thickness of sacrificial oxide, immediately performing an oxide strip and then effecting a thin gate oxidation. The gate oxidation step is characterized by a temperature ramp from 700 to 950 degrees Centigrade in a flow of 9 liters per minute nitrogen and 0.36 liters per minute oxygen. At the 950 degrees Centigrade point, the nitrogen flow ceases and the oxygen flow increases to 9 liters per minute. The temperature is then downwardly ramped to 900 degrees Centigrade.

2 Claims, No Drawings

HIGH QUALITY GATE OXIDES FOR VLSI DEVICES

TECHNICAL FIELD

The invention relates to the fabrication of integrated circuit devices and, more particularly, to a process for forming a thin gate oxide layer in a CMOS transistor.

BACKGROUND OF THE INVENTION

Further reductions in VLSI CMOS geometries require commensurate reduction in the thickness of the gate oxide layer. Because the quality and predictability of the gate oxide tends to degrade as the thickness of the oxide layer is reduced, improvements over existing gate oxide processes are necessary in the effort to achieve and penetrate the one micron milestone CMOS geometry.

Breakdown voltage and leakage current are among the device characteristics critically dependent on the gate oxide thickness. Breakdown voltage may be defined as the voltage, applied between the gate and substrate, required to produce a specified current flow, typically 10 microamperes, through the gate oxide. It may be viewed as a measure of the effectiveness of the oxide as a dielectric. Leakage current is generally defined as the current flowing through the oxide layer as a result of a gate-to-substrate voltage, typically 5 volts, less than the breakdown voltage.

Although the consistency of breakdown voltage measurement data degrades with reductions in the gate oxide thickness encountered, it is known that the average breakdown voltage decreases with decreasing oxide thickness. Leakage current, on the other hand, has been found to increase dramatically with decreasing gate oxide thickness. For example, 1.2 micron CMOS devices fabricated according to a process not benefitted by the subject invention have yielded leakage current measurements beyond the 10 microampere value. Furthermore, breakdown voltage measurements on such devices have produced values of approximately 20 volts, at a standard deviation in excess of 4 volts. Target requirements for the 1.2 micron devices had been 20 volts minimum breakdown voltage and 1 nanoampere leakage current at 5 volts.

An additional requirement of fine geometry CMOS devices is low surface state charge. Surface state charge may be empirically determined from the well known theoretical equation for the threshold voltage of a MOS device. The determination may be derived from CV (i.e., capacitance - voltage) measurements performed on the device using commercially available test equipment. For the device geometries alluded to above, the requirement corresponds to a flat band voltage shift in a C-V plot, of less than 0.1 volt at a temperature bias of 300 degrees Centigrade. Satisfaction of this requirement is deemed largely problematic without resort to the invention disclosed herein.

DISCLOSURE OF THE INVENTION

The above and other objects advantages and capabilities are achieved in one aspect of the invention by a process of gate oxide formation that includes the steps of growing a predetermined thickness of sacrificial oxide, subsequently performing an oxide strips and then effecting a thin gate oxidation. The gate oxidation step is characterized by a temperature ramped from 700 to 950 degrees Centigrade in a flow comprising 9 liters per minute nitrogen and 0.36 liter per minute oxygen. At the 950 degree Centigrade point, the nitrogen flow ceases and the oxygen flow increases to 9 liters per minute. Temperature is then downwardly ramped to 900 degrees Centigrade.

DESCRIPTION OF A PREFERRED EMBODIMENT OF THE INVENTION

For a better understanding of the subject invention, reference is made to the following description and appended claims.

The invention relates to the portion of a CMOS fabrication process that takes place subsequent the growth of the field oxide regions about the active areas of the CMOS device. A primary objective of the inventive process is to ensure that the interface between the gate oxide and the silicon is as clean as possible. Accordingly, a sacrificial oxide layer, approximately 1000 Angstroms in thickness, is grown over the semiconductor material. This is followed by an immediate wet chemical oxide strip over predetermined areas of the sacrificial layer. A thin gate oxide layer is then grown according to the following parameters.

The gate oxide is grown concomitant a flow comprising nine liters per minute nitrogen and 0.36 liter per minute oxygen. During the flow temperature is ramped upward from 700 to 950 degrees Centigrade. At the 950 degree Centigrade point, the nitrogen flow is caused to cease and the oxygen flow is increased to nine liters per minute. Temperature is then downwardly ramped from 950 to 900 degree Centigrade.

The improved gate oxide process has been found to result in substantial reduction in leakage current at 5 volts. In addition, breakdown voltage improved to 22.0 volt with a standard deviation of 0.5 volt. Furthermore the static surface charge obtained by CV measurement was found to be approximately $9 \times 10^{10}$ atoms/cm$^2$.

Accordingly, while there has been described what at present is deemed to be the preferred method of practicing the invention, it will be obvious to those having ordinary skills in the art, that various changes and modification may be made therein without departure from the scope of the invention as defined by the appended claims.

What is claimed is:

1. A method of forming a gate oxide layer for a CMOS device, the method comprising the steps of:
   (a) growing a predetermined thickness of sacrificial oxide on a semiconductor surface,
   (b) performing an immediate wet chemical oxide strip of predetermined portions of the sacrificial layer,
   (c) establishing a flow consisting essentially of approximately 9 liters per minute nitrogen and 0.36 liters per minute oxygen during a temperature ramp from 700 to 950 degrees Centigrade,
   (d) at 950 degrees Centigrade, causing the nitrogen flow to cease and the oxygen flow to increase to 9 liters per minute, and
   (e) downwardly ramping temperature from 950 to 900 degrees Centigrade.

2. A method according to claim 1 wherein the sacrificial oxide layer is grown to a thickness of approximately 1000 Angstroms.

* * * * *

UNITED STATES PATENT AND TRADEMARK OFFICE
CERTIFICATE OF CORRECTION

PATENT NO. : 4,574,466
DATED : March 11, 1986
INVENTOR(S) : George F. Hagner; Kothandaraman Ravindhran It is certified that error appears in the above—identified patent and that said Letters Patent is hereby corrected as shown below:

On the front page, after "Assignee:" delete "GTE Communication

Systems Corporation, Phoenix, Ariz." and insert therefor:

--GTE Laboratories, Incorporated, Tempe, Ariz.--

Signed and Sealed this

Twenty-first Day of April, 1987

Attest:

DONALD J. QUIGG

Attesting Officer

Commissioner of Patents and Trademarks